US006391082B1

(12) United States Patent
Holl

(10) Patent No.: US 6,391,082 B1
(45) Date of Patent: *May 21, 2002

(54) COMPOSITES OF POWDERED FILLERS AND POLYMER MATRIX

(75) Inventor: Richard A. Holl, Oxnard, CA (US)

(73) Assignee: Holl Technologies Company, Camarillo, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/345,813

(22) Filed: Jul. 2, 1999

(51) Int. Cl.⁷ ................................................. C22C 1/05
(52) U.S. Cl. ............................... 75/230; 149/5; 149/10; 428/548
(58) Field of Search ........................ 419/5, 10; 75/230; 428/548

(56) References Cited

U.S. PATENT DOCUMENTS

| | | | |
|---|---|---|---|
| 4,287,075 A | | 9/1981 | Fujiwara et al. |
| 4,335,180 A | | 6/1982 | Traut |
| 4,889,909 A | | 12/1989 | Besecke et al. |
| 5,154,973 A | | 10/1992 | Imagawa et al. |
| 5,198,137 A | * | 3/1993 | Rutz et al. .................. 428/412 |
| 5,204,416 A | | 4/1993 | Mercer et al. |
| 5,212,278 A | | 5/1993 | Pfandner |
| 5,268,140 A | * | 12/1993 | Rutz et al. .................... 419/54 |
| 5,279,463 A | | 1/1994 | Holl |
| 5,358,775 A | | 10/1994 | Horn, III |
| 5,391,603 A | | 2/1995 | Wessel et al. |
| 5,395,914 A | | 3/1995 | Wilharm et al. |
| 5,449,652 A | | 9/1995 | Swartz et al. |
| 5,506,049 A | | 4/1996 | Swei et al. |
| 5,538,191 A | | 7/1996 | Holl |
| 5,552,210 A | | 9/1996 | Horn, III et al. |
| 5,658,485 A | | 8/1997 | Cava et al. |
| 5,658,994 A | | 8/1997 | Burgoyne, Jr. et al. |
| 5,659,006 A | | 8/1997 | White |
| 5,693,742 A | | 12/1997 | White et al. |
| 5,739,193 A | | 4/1998 | Walpita et al. |
| 5,754,936 A | * | 5/1998 | Jansson ....................... 419/10 |
| 5,874,516 A | | 2/1999 | Burgoyne, Jr. et al. |
| 5,929,138 A | | 7/1999 | Mercer et al. |
| 5,998,533 A | | 12/1999 | Weber et al. |
| 6,039,784 A | * | 3/2000 | Luk ........................... 75/231 |
| 6,074,472 A | | 6/2000 | Jachow et al. |
| 6,093,636 A | | 7/2000 | Carter et al. |
| 6,143,052 A | * | 11/2000 | Kiyokawa et al. ............ 75/230 |

FOREIGN PATENT DOCUMENTS

| | | |
|---|---|---|
| JP | 11322920 A2 | 11/1999 |
| WO | WO 97 42639 | 11/1997 |

OTHER PUBLICATIONS

P. 42 of "Materials and Processes for Microwave Hybrids", by Richard Brown, published 1989 by International Society for Hybrid Microelectronis, Reston VA ( See p. 2, lines of this application)

"Production Capabilities," www.pooleplastics.com/production.html, Poole Plastics and Tooling Company (Feb. 15, 2001).

* cited by examiner

Primary Examiner—Ngoclan Mai
(74) Attorney, Agent, or Firm—Christopher Darrow; Oppenheimer, Wolff, Donnelly LLP

(57) ABSTRACT

Composite materials comprising at least 60 volume %, preferably 70 volume %, of particles of finely powdered filler material in a matrix of poly(arylene ether) polymer material are made by forming a mixture of the components, forming the required bodies therefrom, and then heating and pressing the bodies to a temperature sufficient to melt the polymer and to a pressure sufficient to disperse the melted polymer into the interstices between the filler particles. Surprisingly these polymer materials can only be effective as bonding materials when the solids content is as high as that specified, since with lower contents the resultant bodies are too friable. This is completely contrary to accepted prior art practice which considers that composites are progressivly weakened as the solids content is increased, so that such content must be limited. In processes to obtain as complete a dispersion of the components as possible they are individually dispersed in a liquid dispersion medium containing the polymer together with necessary additives, each mixture being ground if required to obtain a desired particle size, the mixtures are mixed, again ground to produce thorough dispersion, are separated from the liquid dispersion medium and green articles formed from the resulting pasty mixture. The green articles are then heated and pressed as described above. Mixtures of different filler materials may be used to tailor the electrical and physical properties of the final materials. The articles preferably comprise substrates for use in electronic circuits.

50 Claims, 3 Drawing Sheets

COMPOSITES OF POWDERED FILLERS AND POLYMER MATRIX

TECHNICAL FIELD

The invention is concerned with methods for the manufacture of composite materials consisting of particles of finely powdered filler material bonded in a matrix of polymer material, and new composite materials made by such methods.

BACKGROUND ART

The electronics industry is an example of one which makes substantial use of printed wiring boards and substrates as supports and dielectric participants for electronic circuits, such substrates consisting of thin flat pieces produced to exacting specifications as to starting material and physical and electrical properties. The history of the industry shows the use of progressively higher operating frequencies and currently for frequencies up to about 800 megahertz (MHz) copper coated circuit boards of glass fiber reinforced polymers, such as epoxies, cyanide esters, polytetrafluoroethylene (PTFE) and polyimides, have been and are still used. At present one popular laminate material for such applications is FR-4, consisting of epoxy resin deposited on a woven glass fabric, because of its ease of manufacture and low cost. Typically this material has a dielectric constant of 4.3–4.6 and a dissipation factor of 0.016–0.022 and is frequently used in computer related applications below about 500 MHz frequencies. Mobile telephones now operate at frequencies of 1–40 GHz and some computers already at 0.5 GHz, with the prospect of higher frequencies in the future. The lowest possible value of dielectric constant is preferred in computer applications to improve signal speed. At higher operating frequencies above approximately 0.8 GHz, FR-4 and similar materials are materials, despite their low cost, are no longer entirely suitable, primarily because of unacceptable dielectric losses, heating up, lack of sufficient uniformity, unacceptable anisotropy, unacceptable mismatch of thermal expansion between the dielectric material and its metallization, and anisotropic thermal expansion problems as the operating temperatures of the substrates fluctuate. These thermal expansion problems result from the relatively large coefficients of thermal expansion of the polymers used as substrate material, and the unequal expansion coefficients of reinforcing fibers in their length and thickness dimensions. For frequencies above 800 MHz the dielectric material of the substrates become an active capacitative participant in signal propagation and here the current materials of choice are certain ceramics formed by sintering or firing suitable powdered inorganic materials, such as fused silica; alumina; aluminum nitride; boron nitride; barium titanate; barium titanate complexes such as $Ba(Mg_{1/3}Ti_{2/3})O_2$, $Ba(Zr,Sn)TiO_4$, and $BaTiO_3$ doped with $Sc_2O_3$ and rare earth oxides; alkoxide-derived $SrZrO_3$ and $SrTiO_3$; and pyrochlore structured $Ba(Zr,Nb)$ oxides. Substrates have also been employed consisting of metal powders, and semiconductor powders embedded in a glass or polymer matrix, a particular preferred family of polymers being those based on PTFE.

For example, ceramic substrates that have been used for hybrid electronic circuit applications comprise square plates of 5 cm (2 ins) side, their production usually involving the preparation of a "slip" (slurry) of the finely powdered materials dispersed in a liquid vehicle, dewatering the slip to a stiff leathery mixture, making a "green" preform from the mixture, and then sintering the preform to become the final substrate plate. The substrates are required to have highly uniform values of thickness, grain size, grain structure, density, surface flatness and surface finish, with the purpose of obtaining uniform dielectric, thermal and chemical properties, and also to permit the uniform application to the surfaces of fine lines of conductive or resistive metals or inks.

Such sintered products inherently contain a number of special and very characteristic types of flaws. A first consists of fine holes created by the entrainment of bubbles in the ceramic pre-casting slip of sizes in the range about 1–20 micrometers; these bubbles cannot be removed from the slip by known methods and cause residual porosity in the body. As an example, sintered alumina substrates may have as many as 800 residual bubble holes per sq/cm of surface (5,000 per sq/in). Another flaw is triple-point holes at the junctions of the ceramic granules when the substrate has been formed by roll-compacting of spray-dried powder; they are of similar size to the bubble holes and appear in similar numbers per sq/cm. Yet another consists of "knit-lines", which are webs or networks of seam lines of lower density formed at the contact areas between butting particles during cold pressing. Two other common flaws are caused by inclusions of foreign matter into the material during processing, and the enlarged grains caused by agglomeration of the particles despite their initial fine grinding. The usual inclusions are fine particles due to abrasive wear of the grinding media in the mills. Both inclusions and agglomerates will sinter in a matrix at a different rate from the remainder of the matrix and can result in flaws of much greater magnitude than the original inclusion or agglomerate.

Costly mirror-finishing by diamond machining and lapping of the ceramic surfaces is required to allow the accurate deposition of sputtered metallization layers from which conductor lines are formed by etching. Mirror-finishes are required because the electrical currents at frequencies above 0.8 GHz move predominantly in the skin of a conductor line while in the lower frequencies they occupy the entire crossection of the conductor line. The thickness of the skin through which currents move at GHz frquencies becomes thinner as frequencies rise and are already as thin as 1 to 2 micrometers in copper at around 2 GHz. Any surface roughness of the conductors on the top and bottom sides will therefor contribute to considerable conductive losses. For example, at a frequency of 4 GHz, the conductive loss at of the interface between conductor and substrate is 1.65 times higher at a RMS roughness of 40 compared to a RMS roughness of 5 (See P.42 of Materials and Processes for Microwave Hybrids, Richard Brown, published 1989 by the International Society for Hybrid Microelectronics of Reston, Va.)

There is therefore continuing interest in methods for manufacturing composite materials for the production of electronic substrates and for use as electronic packaging materials, with which sintering and the high processing temperatures required together with their attendant difficulties, high cost of diamond machining and lapping, and the associated considerable costs are avoided.

The low inherent mechanical strength of the currently available matrix forming polymers and their excessive thermal expansion coefficient has made it necessary to embed reinforcing materials, such as woven glass fiber cloth, into the substrate body, to strengthen it and also to contrain its excessive thermal expansion. But such reinforcing materials unfortunately cause unacceptable inhomogenity of the structure. For example, the presence of such reinforcing material makes it difficult to incorporate powdered filler materials uniformly into the body of the substrate. Another difficulty is caused by the generally poor adhesion exhibited by the commercially available matrix polymers toward the usual filler materials, and extensive research and development has been undertaken in the past, and is continuing, in connection with known substrate-forming polymers, such as PTFE, to find coupling agents that will provide adequate adhesion between the polymer and the powder components, and thus satisfactory mechanical strength in the resultant substrates.

Dielectric materials are commonly used as insulating layers between circuits, and layers of circuits in multilayer integrated circuits, the most commonly used of which is silica, which in its various modifications has dielectric constants of the order of 3.0–5.0, more usually 4.0–4.5. Low values of dielectric constant are preferred and organic polymers inherently usually have low dielectric values in the range 1.9–3.5, so that considerable research and work has been done to try to develop polymers suitable for this special purpose, among which are polyimides (frequently fluorinated), PTFE, and fluorinated poly(arylene ethers), some of the materials having dielectric constants as low as that of air, i.e. 1.00. At the present time fluorination is the most common modification of the polymers employed in view of the improvements obtained comprising lowered dielectric constants, enhanced optical transparency, and reduced hydrophilicity and solubility in organic solvents, but the fluorination usually results in the polymers exhibiting a degree of polarization which can cause problems in obtaining the desired dielectric properties.

U.S. Pat. No. 5,658,994, issued Aug. 19, 1997, and U.S. Pat. No. 5,874,516, issued Feb. 23, 1999, both to Air Products and Chemicals, Inc. of Allentown, Pa., the disclosures of which are incorporated herein by this reference, disclose and claim a unique utility as a dielectric coating material for micro-electronic devices of a class of poly (arylene ethers) as a replacement for silica-based dielectric materials, wherein the poly(arylene ether) does not have nonaromatic carbons (other than perphenylated carbon), fluorinated substituents or significantly polarizable functional groups. These materials, which are relatively easily synthesized, are found surprisingly to have an excellent combination of desirable properties, namely thermal stability, low dielectric constant values, low moisture absorption and low moisture outgassing.

U.S. Pat. No. 5,658,994 discloses and claims in its broadest aspect an article of manufacture comprising a combination of a dielectric material and a microelectronic device, wherein the dielectric material is provided on the microelectronic device and contains a poly(arylene ether) polymer consisting essentially of non-functional repeating units of the structure:

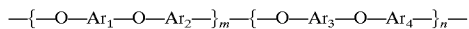

wherein m=0 to 1.0; and n=1.0-m; and $Ar_1$, $Ar_2$, $Ar_3$ and $Ar_4$ are individually divalent arylene radicals selected from the group consisting of: phenylene; biphenyl diradical; para-terphenyl diradical; meta-terphenyl diradical; ortho-terphenyl diradical; naphthalene diradical; anthracene diradical; phenanthrene diradical; diradicals of 9,9-diphenylfluorene of specific type; and 4,4'-diradical of dibenzofuran and mixtures thereof, but $Ar_1$, $Ar_2$, $Ar_3$, and $Ar_4$, other than the diradical 9,9-diphenylfluorene, are not isomeric equivalents.

U.S. Pat. No. 5,874,516 claims poly(arylene ether) consisting essentially of non-functional repeating units of the structure:

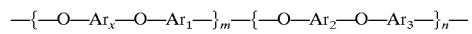

wherein m=0.2 to 1.0; and n=1.0-m; and $Ar_1$, $Ar_2$, and $Ar_3$ are individually divalent radicals selected from the group defined in the preceding paragraph; or essentially of non-functional repeating units of the structure:

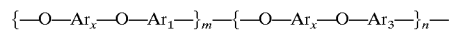

wherein m=0 to 1.0; and n=1.0-m; $Ar_x$ is a special radical 9,9-bis(4-oxyphenyl)fluorene and $Ar_1$, and $Ar_3$ are individually divalent radicals also selected from the group defined in the immediately preceding paragraph.

Variations in $Ar_1$, $Ar_2$, $Ar_3$ and $Ar_4$ are stated to allow access to a variety of properties such as reduction or elimination of crystallinity, modulus, tensile strength, high glass transition temperature, etc. The polymers are said to be essentially chemically inert, have low polarity, have no additional functional or reactive groups, and to be thermally stable at temperatures of 400°–450° C. in inert atmospheres. In addition to the basic polymer structures as outlined above the polymers may also be cross-linked, either by cross-linking itself, through exposure to temperatures in the range of 350°–450° C., or by providing a cross-linking agent, as well as end capping the polymer with known end capping agents, such as phenylethynyl, benzocyclobutene, ethynyl and nitrile. The ability to crosslink at elevated temperatures, with the consequent marked increase in molecular weight and density makes the materials particularly useful in microelectronic applications because they can readily be applied from solution and then converted to a solvent resistant coating by heating.

The specified polymers are non-functional in that they are chemically inert and they do not bear any functional groups that are detrimental to their application in the fabrication of microelectronic devices. They do not have carbonyl moieties such as amide, imide and ketone, which promote adsorption of water. They do not bear halogens such as fluorine, chlorine, bromine and iodine which can react with metal sources in metal deposition processes. They are composed essentially of aromatic carbons, except for the bridging carbon in the 9,9-fluorenylidene group, which has much of the character of aromatic carbons due to its proximity to aromatic structures; for the purposes of the invention the carbon is deemed to be a perphenylated carbon.

The polymers are proposed for use as coatings, layers, encapsulants, barrier regions or barrier layers or substrates in microelectronic devices. These devices may include, but are not limited to multichip modules, integrated circuits, conductive layers in integrated circuits, conductors in circuit patterns of an integrated circuit, circuit boards as well as similar or analogous electronic structures requiring insulating or dielectric regions or layers. They are also proposed for use as a substrate (dielectric material) in circuit boards or printed wiring boards. Such a circuit board has mounted on its surface patterns for various electrical conductor circuits, and may include various reinforcements, such as woven nonconducting fibers, such as glass cloth. Such circuit boards may be single sided as well as double sided or multilayer.

It is proposed that additives can be used to impart particular target properties, as is conventionally known in the polymer art, including stabilizers, flame retardants, pigments, plasticizers, surfactants, and the like. It is also proposed that adhesion promoters can be used to adhere the polymers to the appropriate substrates. Such promoters are typified by hexamethyldisilazane, which can be used to interact with available hydroxyl functionality that may be present on a surface, such as a silica surface.

DISCLOSURE OF THE INVENTION

The principal object of the invention is to provide new methods for manufacturing composite materials consisting of particles of finely powdered filler material bonded together in a matrix of polymer material, such new composite materials, and articles made from such composite materials.

It is another object to provide such new methods with which the resultant composite materials and articles comprises at least 60 percent by volume of the filler material, with the remainder consisting of the polymer material matrix together with any necessary additives.

In accordance with the invention there is provided a method of manufacturing composite materials comprising particles of finely powdered filler material uniformly distributed in a matrix of polymer material, the method comprising the steps of:

mixing together from 60 to 97 volume percent of particles of the filler material of minimum pore volume when compacted and the balance of polymer bonding material consisting of nonfunctionalized poly(arylene ether) to form a composite mixture; and subjecting the composite mixture to a temperature sufficient to melt the polymer material and to a pressure sufficient to uniformly disperse the melted polymer material into the interstices between the particles of filler material.

Also in accordance with the invention there are provided composite materials comprising particles of finely powdered filler material uniformly distributed in a matrix of polymer material, the materials comprising:

from 60 to 97 volume percent of particles of the compacted filler material and the balance of polymer material consisting of nonfunctionalized poly(arylene ether) together forming a uniform composite mixture;

wherein the composite mixture has been subjected to a temperature sufficient to melt the polymer material and to a pressure sufficient to uniformly disperse the melted polymer material into the interstices between the particles of filler material.

Preferably the polymer material is of maximum dimension or maximum equivalent spherical dimension of 50 μm.

DESCRIPTION OF THE DRAWINGS

Methods and apparatus for the production of the new composite materials, and new composite materials and articles made of such new composite materials, produced using such methods and apparatus, that are particular preferred embodiments of the invention will now be described, by way of example, with reference to the accompanying diagrammatic drawings wherein.

DESCRIPTION OF THE PREFERRED EMBODIMENTS

Figure 1:
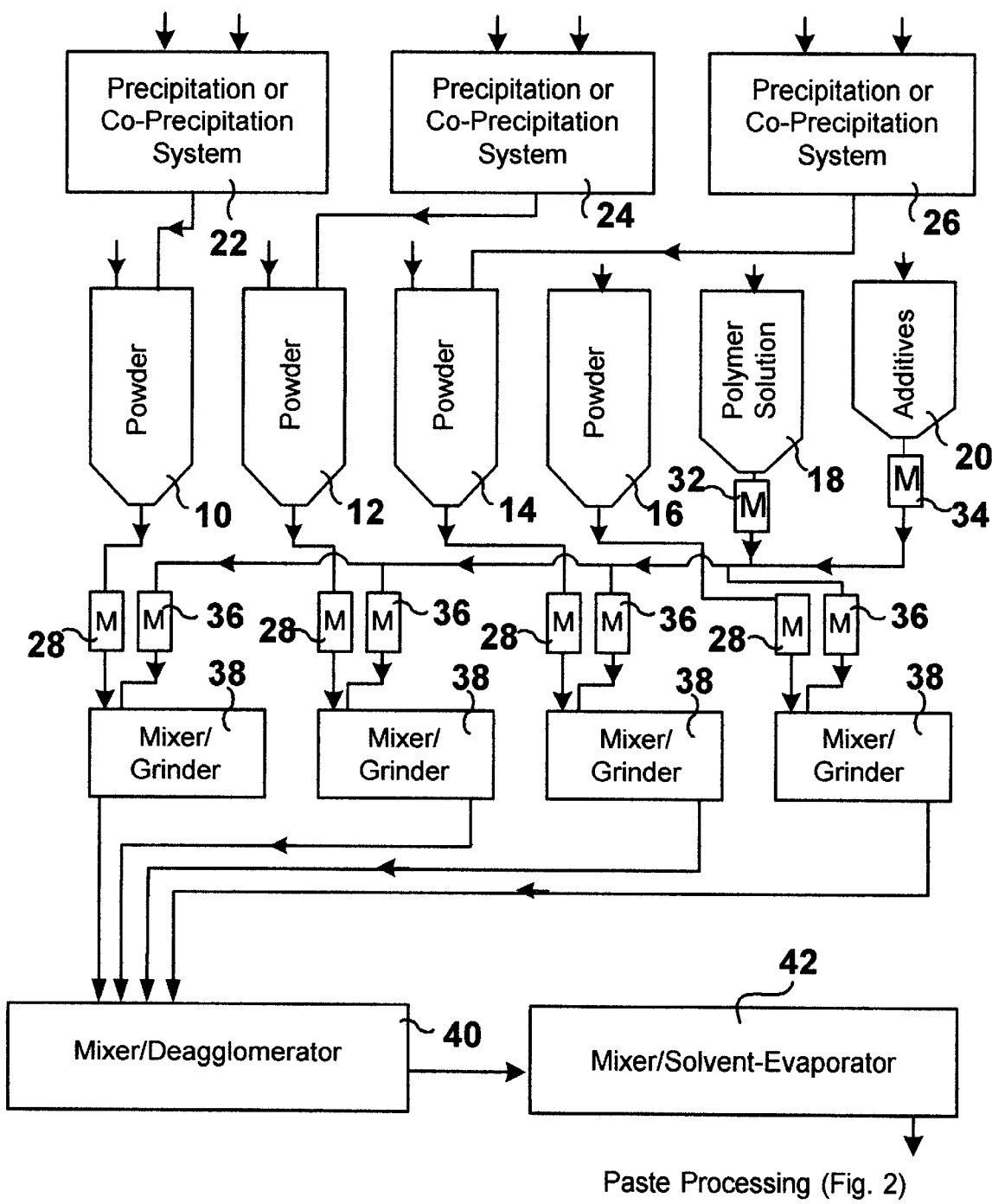
FIG. 1 is the first part of a block flow diagram of the specific method and apparatus for the manufacture of the composite materials and articles of the invention, particularly for the manufacture of flat rectangular copper clad substrates intended for use for electronic circuits.
Figure 2:
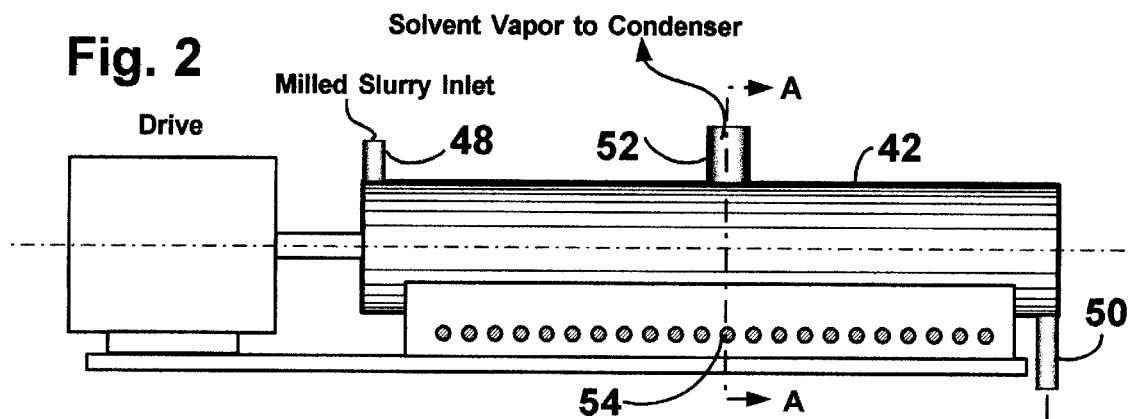
FIG. 2 is side elevation of a mixer/solvent evaporation mill shown in outline in FIG. 1.
Figure 3:
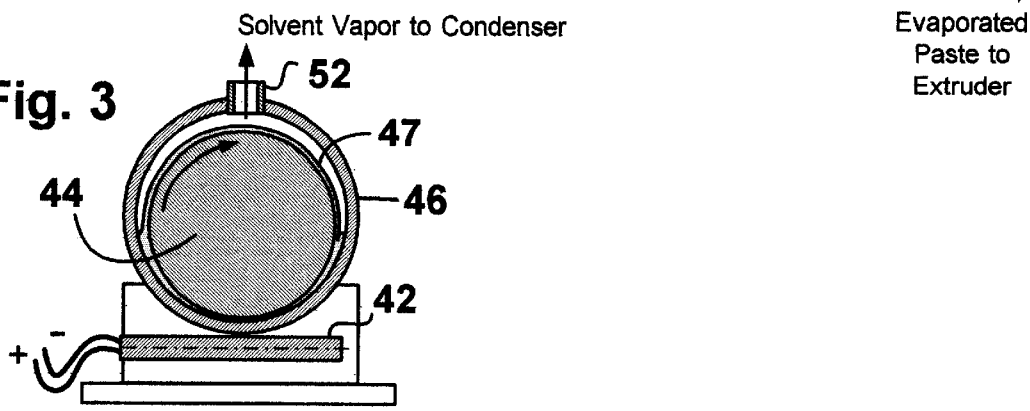
FIG. 3 is a cross-section through the mill of FIG. 2, taken on the line A—A therein.
Figure 4:
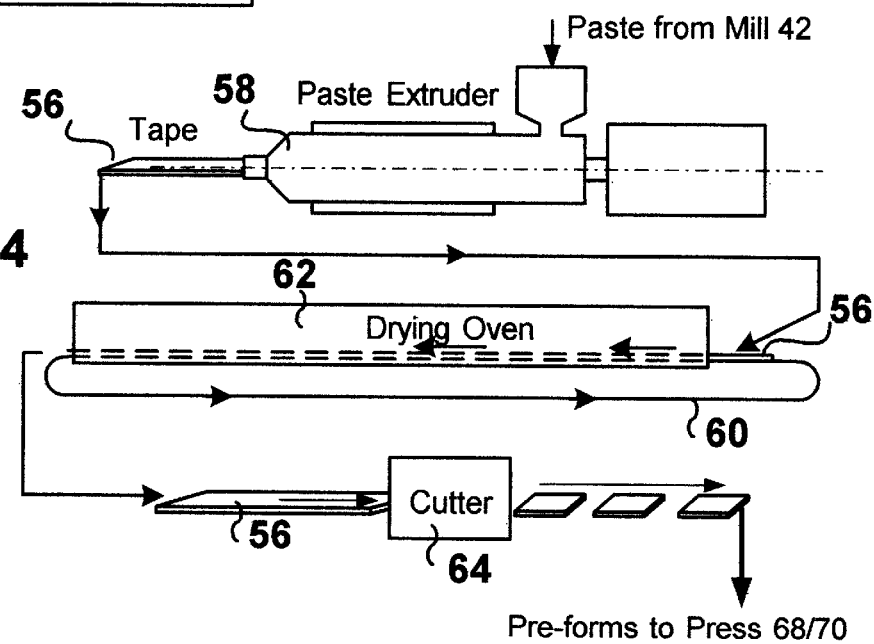
FIG. 4 is another part of the block flow diagram, continuing from FIG. 1.
Figure 5:
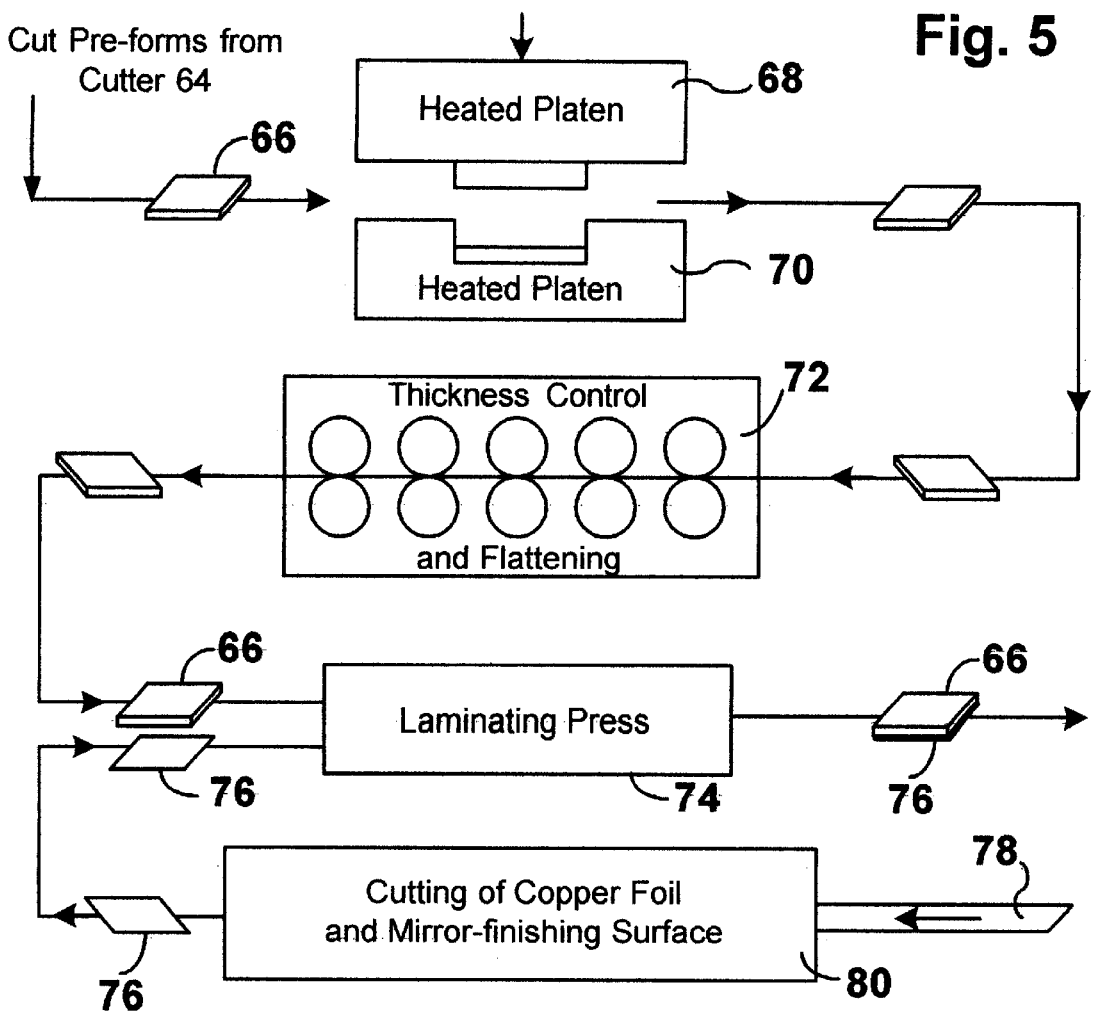
FIG. 5 is a further part of the block flow diagram, continuing from FIG. 4.

I have discovered that unexpectedly a particular sub-family of a known family of polymers, namely poly(arylene ethers), exhibit unusually high inherent adhesiveness toward finely ground filler materials of the kind that can be employed in combination with matrix materials to produce electronic substrates and that, also unexpectedly, the production of useful composite materials requires a complete reversal of approach from that which has previously been employed in the production of composite materials. A major problem in the prior art processes of forming composite materials, and in the substrates obtained thereby, is the progressive loss of mechanical strength that results as the filler solids content is increased, and hitherto attempts to incorporate more than about 40 volume percent generally has resulted in composites which are so friable that they literally collapse to a heap of sand-like material if in testing they are stressed to the degree required in commercial practice. Moreover, it has been found difficult with prior art processes to incorporate as much as 40 volume percent solids material, since the mixtures become so viscous that uniform mixing is virtually impossible. Consequently, the approach has of necessity been to incorporate only as much filler material as will result in a substrate of adequate mechanical strength, and to accept the lower desired electrical characteristics that result. I have discovered however that with the methods of the invention, for the successful production of composite materials, the solids content must instead be increased to values well beyond those of the conventional prior art. An acceptable minimum for my new composite materials is 60 volume percent, in that such materials are of the required minimum mechanical strength, it being found that the mechanical strength increases with increased solids content, instead of decreasing, up to the value of about 95–97 volume percent, or beyond which the proportion of polymer is reduced below the minimum value required to maintain adequate adhesion between the uniformly distributed filler particles. It is my belief that a possible explanation for this highly unexpected result, although other explanations may be possible, and therefore I do not intend that the invention be limited thereby, is that although the chosen polymers exhibit unusually high adhesion, especially toward oxide materials such as silica, aluminum oxide, metal powders and boron nitride, they are not particularly mechanically strong, and therefore are most effective in this new and special application if employed in the form of very thin adherent layers interposed between the filler particles, such as can only be obtained with the methods of the invention and when the solids content is sufficiently high. It is difficult to specify with any degree of accuracy the optimum thicknesses for the interposed layers; it is known that layers of 1–3 micrometers are very successful in giving superior adhesion with adequate strength, and a possible upper limit is 40 micrometers (0.001 in).

Composite materials of the invention can be made by mixing together the required portion by weight, or by volume, of particles of the chosen non-polar, nonfunctionalized polymer material of sufficiently small dimension, or equivalent spherical dimension, e.g. in the range 0.1 to 50 micrometers, with the corresponding portion by weight or by volume of the chosen filler material, again of sufficiently small dimension, or equivalent spherical dimension, e.g. in the range 0.1 to 50 micrometers, and subjecting the mixture to a temperature sufficient to melt the polymer material, e.g. in the range 280–400° C. and to a pressure, e.g. in the range 3.5 to 1,380 MPa (500 to 200,000 psi), preferably 70 to 1,380 MPa (10,000 to 200,00 psi), sufficient to disperse the melted polymer material into the interstices between the particles of filler material. By equivalent spherical diameter is meant the diameter of a completely spherical particle having the same volume as the specified particle. In alternative processes which are described in more detail below the polymer may be added in the form of a solution thereof, provided steps are taken to remove all of the solvent once the filler and polymer materials have been uniformly mixed together. The polymer material preferably is selected from the group comprising polyarylene ether-2, polyarylene ether-3, and polyarylene ether-4, which materials are described in more detail below, while the filler material is selected from the group comprising particles of inorganic material, particles of electromagnetic material, particles of a core of inorganic material, covered with a layer of a metal oxide material, particles of metal material particles of magnetic material, and particles of low dielectric constant high melting point polymer material, all of which particles may be hollow.

The resultant heated and pressurized composite mixture may be formed into a sheet, film or tape, onto a surface of which a layer of copper may be applied, either by sputtering or by direct bonding of copper foil under heat and pressure in a vacuum, the sheet, film or tape being formed by a thermoplastic extrusion process. Alternatively, green bodies can be cut from sheet or tape before the heat and pressure step and these green bodies then converted to heated and pressed bodies by a thermoplastic compression process, again to a surface of which a layer of copper can be applied by sputtering or by direct bonding of copper foil under heat and pressure in a vacuum. The resultant bodies may comprise substrates for electronic circuits or enclosures for electronic circuits or devices. The processes of the invention will be described in detail below in connection with the manufacture of such thin flat plates, but it will be apparent that they are applicable also to any shape of molded article with which direct production of superior surface finish, highly uniform micro-structures, and high dimensional uniformity from finished article to article is desired.

With microelectronic devices, and with the higher frequencies now employed, the problems of adequate uniformity of physical and chemical constitution and physical and electrical properties of the substrates have been exacerbated, and the simple mixing processes described above usually will not provide sufficient uniformity, and in such case it becomes necessary to employ a method and apparatus as described in detail below.

Referring now to FIG. 1, in this particular process it is assumed that a mixture of different filler materials are to be used, especially in view of the opportunity this provides of specifically tailoring the mechanical and electrical characteristics of the resultant substrates for the end product. The polymer is used in the form of a solution thereof (usually of about 10% concentration) in a suitable solvent such as cyclohexanone, and the opportunity is taken of employing this solvent also as a liquid dispersion and suspension vehicle for the filler materials. A preliminary mixture is first formed of each of the selected finely powdered filler materials, usually inorganic materials, with the selected polymer solution, although in other processes other vehicles may of course also be used. The filler material or mixture of materials may be obtained respectively by precipitation or coprecipitation from solutions of suitable precursors, and however obtained should have the required purity, dielectric constant, loss tangent, and particle size distribution. In this embodiment up to four different powdered materials can be fed from a delivery and metering system comprising a plurality of hoppers 10, 12, 14 and 16 respectively, while the solution of the polymer in the cyclohexanone is fed from its hopper 18, and suitable surface active functional additives, if required, such as surfactants, plasticizers and lubricants, are fed from a respective hopper 20. Each powdered material can be fed directly to the respective hopper 10, 12, 14, and 16, or alternatively obtained from respective precipitation or coprecipitation systems 22, 24, or 26 (a system for the contents of the hopper 16 is not shown). If the polymer is employed in the form of a powder then it will be fed from the hopper 18, while the dispersion vehicle will be fed from a respective hopper, or perhaps from the hopper 20 along with the additives. The flow of each filler powder from its hopper is continuously precision metered by a respective meter 28, that of the polymer solution is metered by meter 32, that of the surface active additives is metered by meter 34, and those of the combined polymer solution/filler or additive flows are metered by respective meters 36. Each preliminary mixture of polymer solution, powders and additives is delivered into a respective drum type mixer/grinding mill 38, described in more detail below.

One of the aspects of the invention that also distinguishes it from prior art processes is that it is preferred to use low cost powders of a relatively wide range of particle sizes in order to obtain optimum packing together of the particles, and resultant minimization of the interposed polymer layers, as contrasted with the highly uniform size, and consequently expensive, powders which were required, particularly for the production of fired ceramic substrates to achieve adequate uniformity of processing. Prior to the formation of each mixture the respective powder particles usually consist of particles of a range of sizes and agglomerates of many finer particles that can vary even more widely in size, and this must be corrected, particularly the reduction of the agglomerates back to their individual particles. Each mixer/mill 38 operates to mix the components and produce complete dispersion of the powdered material in the liquid vehicle, and also as a grinding mill to mill the respective powder particles and agglomerates to a required size distribution to a obtain a required degree of uniformity, but with a distribution that will also result in a minimum pore volume when compacted.

The proportions of the powder, polymer solution and additives from the hoppers are such as to obtain a solids content in the respective preliminary mixture in the range of 40–95% by volume, the quantities of the dispersing vehicle and the functional additives being kept as low as possible, but sufficient for the consistency of the mixture to be kept to that of a relatively wet paste or slurry, to permit its free flow through the relatively narrow processing flow passages of the respective mill 38, and the subsequent machines. A viscosity in the range of about 100–10,000 centipoises will usually be satisfactory. In the methods of the invention preferably such grinding, deagglomeration and dispersion of each preliminary mixture is carried out simultaneously in its respective mill 38, using for this purpose a special mill which is the subject of my U.S. Pat. No. 5,279,463, issued Jan. 18, 1994, and U.S. Pat. No. 5,538,191, issued Jul. 23, 1996, the disclosures of which are incorporated herein by this reference.

These special mills may be of two major types, in a first of which the mill has two circular coaxial plate members with a processing gap formed between them; the axis of rotation can be vertical or horizontal. It is preferred however to use the second type of mill, which consists of an inner cylindrical member rotatable about a horizontal axis inside a stationary hollow outer cylindrical member, the axes of the two cylinders being slightly displaced so that the facing walls are more closely spaced together at one longitudinal location around their periphery to form, parallel to the axes, what is referred to as a processing or micro gap, and are more widely spaced at the diametrically opposed longitudinal location to form, again parallel to the axes, what is referred to as a complementary or macro gap. The mixture flows through the processing gap producing so-called "supra-Kolmorgoroff" mixing eddies in the portion of the slurry at and close to the macro gap and so-called "sub-Kolmorgoroff" mixing eddies in the micro or processing gap. Ultrasonic transducers may be mounted on the stationary member which apply longitudinal pressure oscillations into the processing gap and reinforce the "sub-Kolmorgoroff" mixing eddies. Such apparatus is capable of processing relatively thick slurries of sub-micrometer particles in minutes that otherwise can take several days in conventional high shear mixers and ball or sand mills.

The separate preliminary mixtures are now mixed together to form a combined mixture having the consistency of a uniform slurry or wet paste by passing them into a mixer/mill 40, in which the combined mixture is subjected to another grinding, deagglomerating and uniform dispersing operation. The mixer/mill 40 is again one of the above-mentioned special mills which are the subject of my U.S. Pat. Nos. 5,279,463 and 5,538,191, being also of the type comprising an inner cylindrical member rotatable inside a stationary hollow outer cylindrical member. Although only a single mixer/mill 40 is employed in this embodiment, in some processes it may be preferred to employ a chain of two or more such mills depending upon the amount and rate of grinding, deagglomeration and mixing that is required.

The milled slurry from the mill 40 passes to a mixer/solvent evaporation mill 42 which again is of the type comprising an inner cylindrical member 44 rotatable inside a stationary hollow outer cylindrical member 46, the paste being carried on the outer cylindrical surface of the member 44 in the form of a thin film 47. In the mill most of the cyclohexanone solvent is removed while the paste is vigorously mixed, the paste becoming continuously thicker as it travels in a helical path from the feed entry point 48 of the evaporation mill to its discharge outlet 50 as more and more solvent is withdrawn through solvent discharge outlet 52, from which it passes to a condenser (not shown) for recovery and reuse. The evaporation of the solvent from this mill is facilitated by heat from a row of cartridge heaters 54 in the base of the machine, their output being such as to obtain a temperature in the tape body of about 150° C. Near to the discharge outlet of the mill the paste is of sufficient stiffness that it can be extruded into a coherent thin tape 56 of the desired dimension in thickness and width using a conventional paste extruding machine 58. Since this tape still contains small amounts of solvent and the additives, it must be subjected to a further heating process in a tunnel dryer oven, and to this end the tape is deposited on an endless conveyor 60, which passes it through a drying oven 62, during which passage the solvent and as much as possible of the additives are removed to leave the strip or tape consisting only of a thoroughly and uniformly dispersed composite mixture of the particles of the filler material or materials and the polymer or polymers. A suitable temperature for such an oven is, for example, in the range 150–250° C., the heating being carried out slowly to avoid as far as possible the formation of bubble holes by the exiting dispersion medium and additives or additive breakdown products.

The tape 56 of dried paste is passed through a cutting station 64, in which it is severed into individual "green" substrate preforms 66, usually of rectangular shape and of the size required for the electronic circuit board substrate, if that is the use for which the materials are intended. The preforms are deposited manually or automatically into the cavity of a heated compression mold comprising heated upper and lower platens 68 and 70, the cavity being located in the lower heated platen 70 to facilitate the loading process. Once the preform is loaded the mold cavity is closed by the downward moving heated top platen 68 which protrudes into the cavity to compress the preform to its required dimensions and density. The temperature to which the preforms are heated in the mold is sufficient to melt the polymer so that it will flow freely under the pressure applied to completely fill the interstices and coat the filler material particles, while the maximum is that at which the polymer will begin to degrade unacceptably. The minimum pressure to be employed is coupled with the choice of temperature, in that it must be sufficient for the melted polymer to flow as described, the pressure and time for which the mold is closed being sufficient for the material of the preforms to attain maximum compaction and density. During the heat and pressure cycle the melted polymer will flow relatively freely and the temperature and pressure are maintained for a period sufficient to ensure that the polymer can completely fill the relatively small interstices between the solid particles in the form of correspondingly very thin layers. Typically the temperature is in the range 280–400° C., while the pressure is in the range 70 MPa to 1,380 MPa (10,150 to 200,000 psi), although a more commercially likely pressure is about 345 MPa (50,000 psi), while pressures as low as 3.5 MPa (500 psi) may be usable. The surfaces of the platens that contact the preforms are mirror-finished or better to assist in obtaining the smooth surfaces that are desired for electronic substrates intended for microwave frequency applications.

Another unexpected advantage of the nonfunctionalised poly(arylene ethers) employed is that, since they may be cross-linked by exposure to temperatures in the range of 350°–450° C. in the presence of oxygen, it is possible to take the finished substrate through a cycle in which initially the polymer is melted again and thoroughly diffused throughout the body, the polymer at this stage being relatively fluid, and thereafter the temperature is increased until cross-linking and corresponding densification of the polymer takes place. Alternatively, the composite mixture may include as an additive a cross-linking agent and/or an end capping agent, so that the desired densification will take place at lower temperatures. As described above this ability to crosslink and/or end cap at elevated temperatures makes the materials particularly useful in microelectronic applications because they can readily be applied as low viscosity materials, e.g. even from solution as described, and then converted to a solvent resistant material of maximum density by the heating.

The substrates 66 issuing from the press are fed to a multi-stand, heated, flattening roller mill 72 in which they are rolled to an accurately controlled thickness and flattened. The surfaces of these rolls are also mirror-finished, or better, again in order to obtain the desired final smooth surfaces. The sheet, film or tape from which the preforms have been cut usually has a thickness less than about 60 mil, can be less than about 30 mil, may be less than about 10 mil, may be less than about 4 mil, and can even be less than about 1 mil. Substrates intended for use in electronic circuits will usually be of thickness in the range 0.125 mm to 1.5 mm (5–60 mil), and if intended for thick film usage are usually required to be smooth to about 0.75–0.90 micrometer (22–40 microins), while if intended for thin film usage must be flat to better than 0.05 micrometer (2 microins). The preforms are now fed to a heated laminating press 74 in which they are each laminated on one or both sides with a thin flat smooth piece 76 of copper sheet of the same size, which subsequently is etched to produce the electric circuit. These sheet copper pieces are obtained by cutting from a strip 78 supplied from a roll thereof (not shown) which is cut into pieces at a cutting and mirror-finish surfacing station 80. The surfacing means comprises a hot press in which the cut pieces are pressed between a pair of heated platens, the platen surfaces being mirror-finished or better so that a corresponding finish is imparted to the surfaces of the pieces. The mirror-finishing of the substrate surfaces and those of the copper pieces is especially important in ultrahigh-frequency applications since, as described above, the currents tend to flow only in the surface layers of the conductors, and uniformity in characteristics of the etched conductors is facilitated by such smooth surfaces.

With the processes of the invention the volume percentage of the filler material can be 60% or more, the minimum value being that at which the interposed layers of polymer are somewhat too thick to have the required mechanical strength for the substrate to have the corresponding amount of mechanical strength. The maximum value is set by the amount of the particular polymer required to adequately bind the particular filler material to form a strong coherent body. Thus, they enable the production of composite materials in which the solids content is easily and economically in the range 60%–97% by volume, preferably 70%–97% by volume. The volume fraction of the polymer in the mixtures is only that needed to adhere the filler material particles together while filling the pores left in the inorganic powder after its compression to minimum pore, preferably pore-free, high density. The relatively small amounts of polymer present in the composite materials must be extremely well and evenly dispersed among the fine particles, and this is readily achievable with the processes employed virtually independently of the particle size of the filler material.

The process and apparatus described above are particularly suited for high volume production of composite materials, but simpler processes requiring less apparatus are also within the scope of the invention. For example, as described above it is also possible to mix together the finely divided filler material and polymer, the dispersion medium, and its necessary additives and thereafter rely upon its processing in one or a series of mixer/mills 38 and/or 40 to produce the required thorough dispersion, while at the same time obtaining the preferred range of particle sizes, the dispersed mixture that is produced thereafter being passed to the drying oven 46 etc., as with the prior process.

In many applications the degree of uniformity required in the material of the finished substrate is such that even the extensive specific process described above may not be sufficient, and it may be necessary to apply an additional series of steps in which the substrates are broken and ground back down to about the original particle size distribution, with the difference that the filler material particles are now intimately associated with particles and thin coatings of the polymer. This finely divided material is again ground and dispersed in a suitable medium by use of one or a chain of the special mills, such as the mills 38 and 40 described above, until the maximum possible uniformity is obtained, when the dispersion medium is removed and the resultant material again subjected to a heating and pressing operation to produce the desired substrates, the polymer being sufficiently thermoplastic at the temperatures required for this to be possible.

Figure 6:
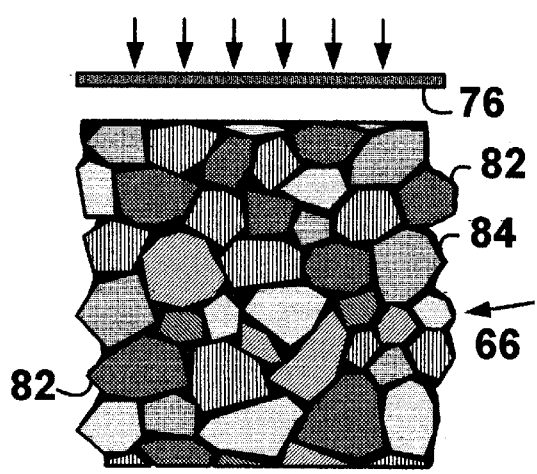
FIGS. 6 and 7 are respective part cross sections to a greatly enlarged scale through a small piece of a typical material of the invention in order to show the grain structure thereof, and showing respectively a layer of metal in position to be applied to a surface, and applied to the surface.
Figure 7:
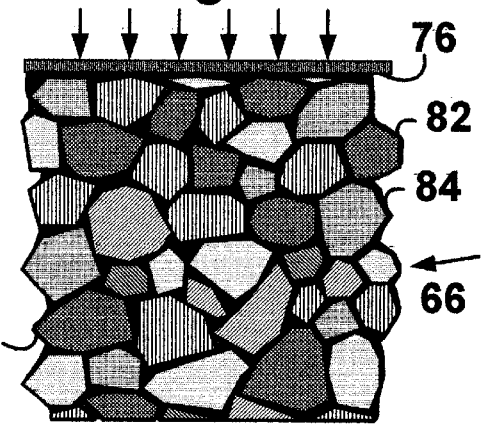

FIGS. 6 and 7 are respective photo micrograph cross sections through a material of the invention, respectively before and after the mirror finished piece 76 of copper sheet is attached to the mirror-finished surface of the substrate, the material consisting of closely packed particles 82 of the filler material, of irregular size and shape, coated and bound together by polymer material 84 that no longer exists as discrete particles but as thin intervening films and interstice-filling masses. As an indication of the size of the particles, etc. involved the square section of FIG. 6 measures 5 micrometers each side. The adhesiveness of the polymers of the invention is sufficient to ensure adequate bonding without the need for reinforcing fibers or fiber-cloth.

A particular currently preferred group of the selected poly(arylene ether) polymers, in which the repeating unit is biphenyl diradical linked with the 4,4'-diradical of 9,9-diphenylfluorene, are designated PAE-2, while another currently preferred group, in which the repeating unit is para-terphenyl diradical linked with the 4,4'-diradical of 9,9-diphenylfluorene, are designated PAE-3, and third currently preferred group, in which the repeating unit is a combination of the units of PAE-2 and PAE-3, are designated PAE-4. Methods for the production of these polymers are disclosed in the above-mentioned U.S. Pat. Nos. 5,658,994 and 5,874,516, to which reference may be made. Samples of these polymers are found to have the following principal characteristics:

|  | PAE-2 | PAE-3 | PAE-4 |
|---|---|---|---|
| Weight average molecular weight Mw | 65,300 | 45,400 | 75,800 |
| Number average molecular weight Mn | 20,700 | 11,400 | 25,700 |
| Mw/Mn | 2.58 | 3.98 | 2.95 |
| Glass transition temperature Tg via DSC | 257° C. | 271° C. | 273° C. |
| Tensile modulus (dynes/cm$^2$) | $1.45 \times 10^{10}$ | $1.45 \times 10^{10}$ | $.39 \times 10^{10}$ |
| Weight loss % at 400° C. after 6 hrs | 0.36 | 0.57 | 0.65 |
| Weight loss % at 450° C. after 6 hrs | 0.91 | 1.65 | 1.26 |
| Wt % gain moisture at 85° F./85 RH | 0.279 | 0.301 | 0.274 |

In the above-mentioned U.S. patents these materials are described as having improved properties, as compared with prior art fluorinated poly(arylene ether) materials designated PAE-1, a particular sample of which has the following comparable characteristics:

| PAE-1 | |
|---|---|
| Weight average molecular weight Mw | 20,000 |
| Number average molecular weight Mn | 7,700 |
| Mw/Mn | 2.58 |
| Glass transition temperature Tg via DSC | 166° C. |
| Tensile modulus (dynes/cm$^2$) | $1.23 \times 10^{10}$ |

-continued

| PAE-1 | |
|---|---|
| Weight loss % at 400° C. after 6 hrs | 0.72 |
| Weight loss % at 450° C. after 6 hrs | 3.16 |

Substrates made using PAE-2 have been very successful; the material does not oxidise in air, is highly adhesive without the use of coupling agents, and has a loss tangent in the frequency range of particular interest (1–10 GHz) less than 0.0008, as compared to most other thermoset polymer materials presently used for electronic circuit applications, namely 0.02–0.005. The polymer is thermoplastic and can be processed at 280–300° C., and by post treating the substrates at 300–400° C. to establish cross-linking they can be rendered thermoset, when the loss tangent drops below 0.0008. Polymers of weight average molecular weight below about 30,000 are regarded as less desirable for use with the methods of the invention, since even more than the PAE-2/3/4 materials they are not able to form adequately structurally strong films, sheets or any other substantially three-dimensional body, because of a tendency of these relatively thick structures to shatter into a multitude of smaller fragments. I have discovered however that surprisingly even the lower molecular weight materials remain intact and cohesive as thin film depositions in the low micrometer range thicknesses of about 1–3 micrometers and can therefore be used, although the higher molecular weight materials are to be preferred.

The relative proportions of the filler materials and of the polymer depend at least to some extent upon the use to which the substrate is to be put; if a very high frequency circuit is to be installed then it will be preferred to have the maximum amount of filler dielectric material and the minimum amount of polymer. As has been described above, the minimum amount of polymer is set by that required to fill the intergrain interstices when the interstitial volume is at its minimum value, and to ensure sufficient coating of the grains for the resulting composite to have the required mechanical strength. For this reason the composites usually require a minimum of 3% by volume of polymer to be present as long as the optimum particle packing of the filler material has been obtained, the remaining 97% solids content comprising the filler dielectric material, residual surface active and coupling agents, and organic or inorganic reinforcing, strength-providing fibers and whiskers, when these are provided.

Materials of relatively small particle sizes are preferred, particularly for the filler starting materials, and also for the polymer if a solid polymer or polymers is employed. The preferred particle size range for the filler starting materials is from 0.01 to 50 micrometers, while that for the polymer is from 0.1 to 50 micrometers. As described above, the presence of particles of filler material of a range comprising different sizes is preferred, since this improves the capability of dense packing in a manner that reduces the interstitial volume, and consequently facilitates the production of the very thin highly adhesive layers that are characteristic of the invention, besides reducing the amount of polymer required to fill the interstices and adhere the particles together. It can be shown theoretically that the minimum interstitial volume that can be obtained when packing spheres of uniform size is about 45%. Owing to the wider particle size distribution that can be employed, this volume can be reduced considerably further, down to the specified value of about 3%.

As described above, there are a number of important parameters for the resultant substrates which must be considered in making a selection of the fillers and polymers to be used. Among those which require the highest possible values are tensile strength; peel strength; solder joint reliability; compliance i.e. low modulus; plated through hole reliability; dielectric constant; chemical inertness; dimensional stability and Q factor. Among those which require the lowest possible values are water absorption; crosstalk v line spacing; and loss tangent or dissipation factor (reciprocal of Q factor).

The methods of this invention are particularly applicable to the production of composite materials in which the finely powdered filler material consists of any one or a mixture of the "advanced" materials that are now used in industry for the production of fired ceramic substrates for electronic circuits, the most common of which are aluminium nitride; barium titanate; barium-neodymium titanate; barium copper tungstate; lead titanate; lead magnesium niobate; lead zinc niobate; lead iron niobate; lead iron tungstate; strontium titanate; zirconium tungstate; the chemical and/or physical equivalents of any of the foregoing; alumina; fused quartz; boron nitride; metal powders; and semiconductors. Another important group is compositions comprising powdered ferrites and like inductive materials in a polymer matrix that have already been produced, used for example in magnetic passive products such as transformers, inductors and ferrite core devices, but the methods used add the powdered filler material into the polymer matrix and their solids contents have generally been limited to not more than about 50% by volume. The invention permits the production of such composite materials of higher solids content, e.g. 80% by volume and above.

At this time the only ceramic materials with temperature stable dielectric constants that are available have values in the ranges 2.6 to 12, 37 to 39 and 80 to 90, whereas in the quickly expanding market of wireless telecommunication, which is based on microwave frequencies ranging from 800 MHz to over 30 GHz, and in which small size and low weight are of increasing importance, the preferred dielectric constant values need to be tailored to be anywhere between 8 and 2000, according to choices dictated by the optimum circuit architecture, instead of, as at present, the circuit architecture being dictated by the very limited ranges of dielectric constants that are available. In microwave or GHz frequencies signal propagation depends mainly on the waveguide character of the circuitry and consequently only such high dielectric constant materials allow significant miniaturization, permitting the use of narrower conductor line widths and shorter lengths. For example, coaxial dielectric resonators, at this time used in more than 25 million cellular telephones worldwide, could be reduced in size and weight by more than half and in cost by more than two thirds if the dielectric constant of the substrate material could be raised from the present value of alumina of about 9 to over 400 and its dielectric loss (loss tangent) kept below 0.0005.

It is possible with these processes to fabricate composite materials in which the powdered filler material is a tailored blend of two or more individual materials. The requirements for substrate materials, especially for very high frequency applications, are very exacting, requiring consideration of a large number of physical properties including filler material content, bulk density (range), surface finish, grain size (average), water absorption (%), flexural strength, modulus of elasticity, coefficient of linear thermal expansion, thermal conductivity, dielectric strength, dielectric constant, dissipation factor, and volume resistivity. The possibility of such blending makes it possible to tailor the properties of the substrates to their specific tasks in a manner which is not possible with a sintered ceramic as in most cases the sintering phase rules would be violated and the resulting fired material would fall apart. One of the main reasons for combining filler materials in any given ratio is to obtain a mixture with a tailored dielectric constant, which constant will remain uniform over a temperature range from say −50° C. to +200° C., and with a very high Q factor (equivalent to a very low loss tangent) desirably above 500 and if possible as high as 5,000.

I claim:

1. A method of manufacturing composite materials comprising particles of finely powdered filler material uniformly distributed in a matrix of polymer material, the method comprising the steps of:

mixing together from 60 to 97 volume percent of particles of the filler material and the balance non-polar polymer bonding material consisting of nonfunctionalized poly (arylene ether) to form a composite mixture; and subjecting the composite mixture to a temperature sufficient to melt the polymer material and to a pressure sufficient to uniformly disperse the melted polymer material into the interstices between the particles of filler material.

2. A method as claimed in claim 1, wherein the polymer material is selected from the group consisting of polyarylene ether-2, polyarylene ether-3, and polyarylene ether-4.

3. A method as claimed in claim 2, wherein the polymer is heated to a temperature in the range 350–450° C. to obtain cross-linking thereof.

4. A method as claimed in claim 2, wherein the composite mixture includes a cross-linking agent and/or an end capping agent.

5. A method as claimed in claim 1, wherein the filler material is selected from the group consisting of particles of inorganic material, particles of electromagnetic material, particles of a core of inorganic material covered with a layer of a metal oxide material, particles of metal material, and particles of low dielectric constant high melting point polymer material, all of which particles may be hollow.

6. A method as claimed in claim 1, wherein the composite mixture is heated to a temperature in the range 280–400° C. at a pressure in the range 3.5 to 1,380 MPa (500 to 200,000 psi).

7. A method as claimed in claim 1, comprising also the steps of:

mixing together the particles of filler material in finely powdered form, the polymer, and a liquid dispersion medium to form a flowable composite mixture thereof;

grinding the flowable composite mixture to uniformly disperse the particles of the finely powdered materials in the liquid dispersion medium;

removing liquid dispersion medium from the flowable composite mixture to produce a pasty composite mixture and forming articles from the composite pasty mixture; and subjecting the articles to the specified temperature and pressure.

8. A method as claimed in claim 7, wherein each of the polymer and the filler material are mixed separately with the liquid respective dispersion medium, and are mixed in respective drum type grinding apparatus to provide uniform dispersion of the components.

9. A method as claimed in claim 7, wherein the composite mixture is mixed in at least one drum type grinding apparatus to provide uniform dispersion of the components.

10. A method as claimed in claim 1, wherein the particles of filler material are of size in the range 0.1 to 50 micrometers and consist of a mixture of filler materials of different chemical compositions.

11. A method as claimed in claim 1, and including the step of forming the heated and pressurized composite mixture into a sheet, film or tape.

12. A method as claimed in claim 11, and including the step of applying a layer of copper to a surface of the sheet, film or tape by a process selected from sputtering and direct bonding of copper foil under heat and pressure in a vacuum.

13. A method as claimed in claim 11, wherein the sheet, film or tape has a thickness less than about 60 mil.

14. A method as claimed in claim 1, and including the step of applying a layer of copper to a surface of the heated and pressurized composite mixture by a process selected from sputtering and direct bonding of copper foil.

15. A method as claimed in claim 1, and including the step of forming substrates for electronic circuits from the heated and pressurized composite mixture.

16. A method as claimed in claim 1, and including the step of enclosing electronic circuits or devices with the heated and pressurized composite mixture.

17. A method as claimed in claim 6, wherein the composite mixture is heated while at a pressure in the range 70 to 1,380 MPa (10,000 to 200,000 psi).

18. A method as claimed in any one of claims 10, 15 or 16, wherein the composite mixture is mixed in at least one drum type grinding apparatus to provide uniform dispersion of the components.

19. A method as claimed in claim 13, wherein the sheet, film or tape has a thickness less than about 10 mil.

20. A method as claimed in claim 13, wherein the sheet, film or tape has a thickness less than about 4 mil.

21. A method as claimed in claim 13, wherein the sheet, film or tape has a thickness less than about 1 mil.

22. A method as claimed in any one of claims 5, 6, 7, 9, 10, 15 or 16, wherein the polymer material is selected from the group consisting of polyarylene ether-2, polyarylene ether-3, and polyarylene ether-4.

23. A method as claimed in any one of claims 5, 6, 7, 9, 10, 15 or 16, wherein the polymer is heated to a temperature in the range 350–450° C. to obtain cross-linking thereof.

24. A method as claimed in any one of claims 6, 7, 9, 10, 15 or 16, wherein the filler material is selected from the group consisting of particles of inorganic material, particles of electromagnetic material, particles of a core of inorganic material covered with a layer of a metal oxide material, particles of metal material, and particles of low dielectric constant high melting point polymer material, all of which particles may be hollow.

25. A method as claimed in any one of claims 7, 9, 10, 15 or 16, wherein the composite mixture is heated to a temperature in the range 280–400° C. at a pressure in the range 3.5 to 1,380 MPa (500 to 200,000 psi).

26. A method as claimed in any one of claims 9, 10, 15 or 16, and comprising also the steps of:

mixing together the particles of filler material in finely powdered form, the polymer, and a liquid dispersion medium to form a flowable composite mixture thereof;

grinding the flowable composite mixture to uniformly disperse the particles of the finely powdered materials in the liquid dispersion medium;

removing liquid dispersion medium from the flowable composite mixture to produce a pasty composite mixture and forming articles from the composite pasty mixture; and subjecting the articles to the specified temperature and pressure.

27. A method as claimed in any one of claims 10, 15 or 16, wherein the composite mixture is mixed in at least one drum type grinding apparatus as disclosed in U.S. Pat. Nos. 5,279,463 and 5,538,191 to provide uniform dispersion of the components.

28. A method as claimed in claim 15 or 16, wherein the particles of filler material are of size in the range 0.1 to 50 micrometers and consist of a mixture of filler materials of different chemical compositions.

29. A method as claimed in any one of claims 1, 2, 3, 5, 6, 7, 9, 10, 15 or 16, wherein the resulting heated and pressed composite material is ground back down to become again finely divided particles of the filler material intimately mixed with the polymer material, and the resultant finely divided particles are again subjected to a heating and pressing operation to produce a solid body of the composite material.

30. Composite materials comprising particles of finely powdered filler material uniformly distributed in a matrix of polymer material, the materials comprising:
from 15 to 97 volume percent of particles of the filler material and the balance non-polar polymer material consisting of nonfunctionalized poly(arylene ether) together forming a composite mixture;
wherein the composite mixture has been subjected to a temperature sufficient to melt the polymer material and to a pressure sufficient to uniformly disperse the melted polymer material into the interstices between the particles of filler material.

31. Materials as claimed in claim 30, wherein the polymer material is selected from the group consisting of polyarylene ether-2, polyarylene ether-3, and polyarylene ether-4.

32. Materials as claimed in claim 30, wherein the filler material is selected from the group consisting of particles of inorganic material, particles of electromagnetic material, particles of a core of inorganic material covered with a layer of a metal oxide material, particles of metal material, and particles of low dielectric constant high melting point polymer material, all of which particles may be hollow.

33. Materials as claimed in claim 30, wherein the particles of filler material are of size in the range 0.1 to 50 micrometers and consist of a mixture of filler materials of different chemical compositions.

34. Materials as claimed in claim 30, and having the form of a sheet, film or tape, wherein the sheet, film or tape has a thickness less than about 60 mil.

35. Materials as claimed in claim 34, and comprising a layer of copper applied to a surface of the sheet, film or tape by a process selected from sputtering and direct bonding of copper foil under heat and pressure in a vacuum.

36. Materials as claimed in claim 30, and having a layer of copper applied to a surface by a process selected from sputtering and direct bonding of copper foil.

37. Materials as claimed in claim 30, and comprising substrates for electronic circuits formed from the heated and pressurized composite mixture.

38. Materials as claimed in claim 30, and comprising electronic circuits or devices enclosed with the composite mixture.

39. Materials as claimed in claim 34, and having the form of a sheet, film or tape, wherein the sheet, film or tape has a thickness less than about 30 mil.

40. Materials as claimed in claim 34, and having the form of a sheet, film or tape, wherein the sheet, film or tape has a thickness less than about 10 mil.

41. Materials as claimed in claim 34, and having the form of a sheet, film or tape, wherein the sheet, film or tape has a thickness less than about 4 mil.

42. Materials as claimed in claim 34, and having the form of a sheet, film or tape, wherein the sheet, film or tape has a thickness less than about 1 mil.

43. Materials as claimed in any one of claims 32, 33, 34, 37 or 38 wherein the polymer material is selected from the group consisting of polyarylene ether-2, polyarylene ether-3, and polyarylene ether-4.

44. Materials as claimed in any one of claims 33, 34, 37 or 38 wherein the filler material is selected from the group consisting of particles of inorganic material, particles of electromagnetic material, particles of a core of inorganic material covered with a layer of a metal oxide material, particles of metal material, and particles of low dielectric constant high melting point polymer material, all of which particles may be hollow.

45. Materials as claimed in any one of claims 34, 37 or 38, wherein the particles of filler material are of size in the range 0.1 to 50 micrometers and consist of a mixture of filler materials of different chemical compositions.

46. Materials as claimed in claim 37, and having the form of a sheet, film or tape, wherein the sheet, film or tape has a thickness less than about 60 mil.

47. Materials as claimed in claim 37, and having the form of a sheet, film or tape, wherein the sheet, film or tape has a thickness less than about 30 mil.

48. Materials as claimed in claim 37, and having the form of a sheet, film or tape, wherein the sheet, film or tape has a thickness less than about 10 mil.

49. Materials as claimed in claim 37, and having the form of a sheet, film or tape, wherein the sheet, film or tape has a thickness less than about 4 mil.

50. Materials as claimed in claim 37, and having the form of a sheet, film or tape, wherein the sheet, film or tape has a thickness less than about 1 mil.

* * * * *